United States Patent
Tramoni et al.

(10) Patent No.: US 10,326,193 B2
(45) Date of Patent: Jun. 18, 2019

(54) METHOD OF MONITORING THE LEVEL OF POWER TRANSMITTED BY A CONTACTLESS COMMUNICATION DEVICE AND CORRESPONDING CONTACTLESS COMMUNICATION DEVICE

(71) Applicants: STMicroelectronics (Rousset) SAS, Rousset (FR); STMicroelectronics razvoj polprevodnikov d.o.o., Ljubljana (SI)

(72) Inventors: Alexandre Tramoni, Le Beausset (FR); Nicolas Cordier, Luynes (FR); Maksimiljan Stiglic, Maribor (SI)

(73) Assignees: STMicroelectronics (Rousset) SAS, Rousset (FR); STMicroelectronics razvoj polprevodnikov d.o.o., Ljubljana (SI)

( * ) Notice: Subject to any disclaimer, the term of this patent is extended or adjusted under 35 U.S.C. 154(b) by 0 days.

(21) Appl. No.: 15/951,774

(22) Filed: Apr. 12, 2018

(65) Prior Publication Data

US 2018/0358680 A1    Dec. 13, 2018

(30) Foreign Application Priority Data

Jun. 9, 2017  (FR) ...................... 17 55163

(51) Int. Cl.
*G06K 7/10* (2006.01)
*H01Q 1/00* (2006.01)
(Continued)

(52) U.S. Cl.
CPC ............. *H01Q 1/002* (2013.01); *G01R 21/00* (2013.01); *G06K 7/10* (2013.01); *H04B 5/0025* (2013.01); *H04W 52/00* (2013.01)

(58) Field of Classification Search
CPC ........... H01Q 1/002; G01R 21/00; G06K 7/10
See application file for complete search history.

(56) References Cited

U.S. PATENT DOCUMENTS

| | | | | |
|---|---|---|---|---|
| 7,439,862 B2* | 10/2008 | Quan | ................. | G06K 7/10128 |
| | | | | 340/10.3 |
| 7,539,466 B2* | 5/2009 | Tan | ...................... | H03G 3/3042 |
| | | | | 330/149 |

(Continued)

OTHER PUBLICATIONS

ISO/IEC 18092, International Standard, "Information technology—Telecommunications and information exchange between systems—Near Field Communication—Interface and Protocol (NFCIP-1)", Second edition, Mar. 15, 2013, 52 pages.

(Continued)

*Primary Examiner* — Seung H Lee
(74) *Attorney, Agent, or Firm* — Slater Matsil, LLP (57) ABSTRACT

In some embodiments, a contactless communication device includes an antenna, and a driving stage having a power supply terminal configured to receive a power supply voltage, where the driving stage is configured to deliver a current to the antenna. The device further includes a monitoring circuit configured to monitor the power transmitted by the antenna. The monitoring circuit is configured, in the presence of a request for a reduction in a current level of transmitted power, to reduce the power supply voltage of the driving stage down to a target value corresponding to a new level of the transmitted power less than the current level.

40 Claims, 8 Drawing Sheets

(51) Int. Cl.
  *H04B 5/00* (2006.01)
  *H04W 52/00* (2009.01)
  *G01R 21/00* (2006.01)

(56) References Cited

U.S. PATENT DOCUMENTS

| | | | |
|---|---|---|---|
| 8,977,197 B2 * | 3/2015 | Krishnan | G06K 7/0008 |
| | | | 455/41.1 |
| 10,079,514 B2 * | 9/2018 | Sone | H02J 5/005 |
| 2005/0156669 A1 | 7/2005 | Ando | |
| 2013/0084799 A1 | 4/2013 | Marholev et al. | |
| 2018/0091192 A1 * | 3/2018 | Tramoni | G01S 13/04 |

OTHER PUBLICATIONS

ISO/IEC 21481, International Standard, "Information technology—Telecommunications and information exchange between systems—Near Field Communication Interface and Protocol—2 (NFCIP-2)", Second edition, Jul. 1, 2012, 10 pages.
ISO/IEC FDIS 14443-2, International Standard, "Identification cards—Contactless intergrated circuit cards—Proximity cards—Part 2: Radio frequency power and signal interface", Sep. 2010, 54 pages.
ISO/IEC FDIS 14443-3, International Standard, "Identification cards—Contactless intergrated circuit cards—Proximity cards—Part 3: Initialization and anticollision", Apr. 2011, 70 pages.
ISO/IEC FDIS 14443-4, International Standard, "Identification cards—Contactless intergrated circuit cards—Proximity cards—Part 4: Transmission protocol", Jun. 2016, 64 pages.

* cited by examiner

METHOD OF MONITORING THE LEVEL OF POWER TRANSMITTED BY A CONTACTLESS COMMUNICATION DEVICE AND CORRESPONDING CONTACTLESS COMMUNICATION DEVICE

CROSS-REFERENCE TO RELATED APPLICATIONS

This application claims priority to French Patent Application No. 1755163, filed on Jun. 9, 2017, which application is hereby incorporated herein by reference.

TECHNICAL FIELD

The present invention relates generally to an electronic device, and in particular embodiments, to a method of monitoring the level of power transmitted by a contactless communication device and corresponding contactless communication device.

BACKGROUND

The antenna connected to electronic components of wireless or contactless communication devices is tuned to a frequency compatible with contactless communication of information. Such a frequency may be, for example, a resonance frequency equal to a carrier frequency, e.g., 13.56 MHz, or a resonance frequency contained in a permissible range around the carrier frequency.

Such components are sometimes referred to as "contactless components" and may be, for example, near field communication (NFC) components, i.e., components compatible with NFC technology.

The NFC component may be, for example, an integrated circuit or chip, incorporating an NFC microcontroller.

The acronym NFC designates a high frequency, short distance wireless communication technology, which makes the exchange of data possible between two contactless devices over a short distance, e.g., 10 cm.

NFC technology is standardized in documents ISO/IEC 18 092, ISO/IEC 21 481 and NFC FORUM but incorporates a variety of pre-existing standards including Type A and Type B protocols of the standard ISO/IEC 14 443.

An NFC component may generally be used either in "reader" mode or in "card" mode for communicating with another contactless device, e.g., by using a contactless communication protocol such as the Type A protocol of the standard ISO/IEC 14 443.

In the "reader" mode, the NFC component acts as a reader with respect to the external contactless device which may then be a card or a label. In the reader mode, the NFC component may then read the contents of the external device and write information to the external device.

In the "card" mode, the NFC component then behaves as a transponder, e.g., a card or a label, and communicates with the external device which this time is a reader.

The transponder may be passive or active.

A passive transponder performs a load modulation of the magnetic field generated by the reader.

An active transponder uses an active load modulation (also known to the person skilled in the art under its acronym ALM) for transmitting information to the reader. The transponder also generates a magnetic field via its antenna which simulates the load modulation of the field of the reader performed by a passive transponder.

Active load modulation is advantageously used when the signal resulting from a passive load modulation is not strong enough to be detected by the reader. This is notably the case when the antenna of the transponder is small or located in an unfavorable environment.

An NFC component or chip may, for example, be incorporated in a mobile cellular phone, and the latter may then be used, in addition to its conventional telephone function, for exchanging information with the external contactless device.

Numerous applications are thus possible, such as crossing a toll barrier in transport (the mobile phone acts as a transport ticket) or payment applications (the mobile phone acts as a credit card).

Active transponders may be specific devices, e.g., contactless smart cards, integrated circuit (IC) cards, labels or badges, or contactless devices or components emulated in card mode, here again, for example, incorporated into host apparatuses such as, for example, mobile cellular phones or tablets.

Contactless components or chips, such as NFC components or chips, are generally connected to the antenna via an impedance matching circuit in order to optimize radio frequency communication. And, the elements used in this impedance matching circuit, e.g., coils and capacitors, are dimensioned so as to make a correct frequency tuning of the antenna possible, e.g., on a carrier frequency, (e.g., 13.56 MHz), and thus to ensure maximum performance.

Furthermore, a contactless component or chip generally includes a driving stage for driving the antenna, which is connected to the terminals of the antenna via the impedance matching circuit, making it possible for a current with the carrier frequency considered (e.g., 13.56 MHz) to be made to flow in the antenna so as to generate the electromagnetic field.

This driving stage generally includes a driving circuit (commonly designated by the person skilled in the art as a "driver") which is preferably supplied with a voltage via a regulator with a low drop out voltage, which commonly designated by the person skilled in the art as a low drop out (LDO) voltage regulator.

For reasons of interoperability, contactless communication standards, e.g., the NFC FORUM standard, require that the transfer of power between a reader and a transponder falls within a certain power range.

When the power transmitted through the antenna of a reader or an active transponder exceeds this range, e.g., when the reader and the transponder are too close, a dynamic power control (DPC) is implemented to reduce this transmitted power.

This reduction in power may also be required by the transponder itself by sending a specific request to the reader, when the transponder supports this functionality which is provided for in the Dynamic Power Level Management (DPLM) amendment of the standard ISO/IEC 14 443.

SUMMARY

Embodiments of the present invention relate to wireless or contactless communication using electronic components connected to an antenna, notably components configured for exchanging information with an external device via said antenna according to a communication protocol of the contactless type and more particularly monitoring the power transmitted by the antenna.

Implementations and embodiments of the invention relate to contactless readers or active transponders, i.e., using an active load modulation. Such readers may be specific apparatuses or contactless devices or components emulated in reader mode, e.g., incorporated into host apparatuses such as, for example, mobile cellular phones or tablets.

The inventors of the present invention have observed that the reduction in power associated with the DPC results in thermal dissipation in the driving circuit and/or the low drop out voltage regulator.

Yet in some cases the thermal overheating of these elements may be detrimental to them if the temperature reached is outside the temperature range for which they are designed to operate correctly.

There is therefore a need to limit the thermal overheating of these elements during a reduction in the power transmitted by the antenna, so as to remain within the acceptable temperature range for these elements.

According to one implementation and embodiment, the thermal overheating of these elements is reduced by acting directly on the power supply voltage of the driving stage, so as to reduce it, instead of acting on the intrinsic features of the driving stage (e.g., reducing the output voltage of the regulator and/or increasing the ohmic resistance of the driving circuit).

In this regard, although it is preferable that the driving circuit includes an LDO regulator, notably for filtering noise, this is, however, optional. Accordingly, if the driving circuit does not include a regulator, the power supply voltage of the driving circuit is then acted upon directly, whereas if the driving circuit is supplied with voltage generated by a regulator, the power supply voltage of the regulator is acted upon.

According to one aspect, provision is made for a method of monitoring the level of the power transmitted by an antenna of a contactless communication device.

The antenna is driven by a driving circuit powered by a power supply voltage and configured for delivering a current at the output to the antenna.

The contactless communication device may include an electronic chip (notably incorporating the driving circuit and at least one part of the power level monitoring circuit) to which the antenna is connected, generally notably via an impedance matching circuit, and this contactless communication device may be a reader or an active transponder. It may also have the capability of being emulated in reader mode or card mode by being, for example, incorporated within a host apparatus, such as an intelligent mobile cellular phone ("smartphone") or a tablet.

When it is coupled to another contactless communication device, the two devices can exchange information according to, for example, a contactless communication protocol, such as that described in the standard ISO/IEC 14 443.

The method according to this aspect includes in the presence of a request for reduction in a current level of the transmitted power, a reduction in the power supply voltage of the driving stage down to a target value corresponding to a new target level of the transmitted power less than the current level.

This new power target level may be a level less than or equal to a permissible power threshold, if, for example, the current level is greater than this permissible power threshold.

This permissible power threshold depends, for example, on the conditions of use of the contactless communication device, in particular on those conditions of coupling with another contactless communication device.

This threshold may be set by a standard governing the contactless communication protocol implemented by the contactless communication device, e.g., the standard ISO/IEC 14 443.

As a variant, the request for reduction in the current power level may take place even if this current power level is not greater than the permissible power threshold.

Thus in DPLM systems, it is possible that the transponder may require a reduction in the current level of power transmitted by the reader, even if this current level is less than the permissible power threshold, simply to reduce consumption, since the transponder is capable of operating at a lower power.

Similarly, in the case of an active transponder using an active load modulation, the current level of power transmitted by the reader may be reduced even if it is not greater than a permissible power threshold, for operating at a lower power target level, e.g., for reasons of stability of communication and better interoperability with existing infrastructures.

A maximum value for the power supply voltage may be defined corresponding to an initial power level, and the reduction in power then begins from the maximum value of power supply voltage.

This initial power level may correspond to a level of power transmitted in the absence of coupling of the antenna with another antenna of another contactless device.

According to one implementation, the driving stage may advantageously include a drop out voltage regulator, e.g., a low drop out voltage regulator, powered by the power supply voltage and delivering an output voltage equal to the power supply voltage reduced by the drop out voltage, and driving circuits coupled to the terminals of the antenna, powered by the output voltage and delivering the current at their output, and the reduction in the voltage of the driving stage includes a reduction in the power supply voltage of the regulator down to the target value, the drop out voltage being unchanged.

According to a particularly advantageous implementation, the power supply voltage may be generated adjustably from an initial voltage, e.g., a voltage from a battery, and an adjustment signal, and the reduction in the power supply voltage includes a preparation of the adjustment signal so as to make it possible for the power supply voltage to reach its target value.

Although the power supply voltage may be generated from different means, e.g., a programmable drop out voltage regulator, or a PMOS transistor, it is particularly advantageous, notably for further limiting thermal dissipation, to generate the power supply voltage at the output of a controllable switched-mode power supply possessing an input receiving the initial voltage and a control input to which the adjustment signal is delivered.

According to one implementation, when the contactless communication device is a reader or is emulated in reader mode, the method includes, for example, a measurement of the current delivered at the output of the driving stage, a comparison of the measured current with at least one current threshold, the result of the comparison corresponding either to the presence of the request for reduction in power transmitted or to an absence of the request.

More precisely, a first current threshold may, for example, be defined, corresponding, for example, to an absence of coupling of the antenna with another antenna of a contactless transponder, and at least one additional current threshold, greater than the first threshold, and the crossing of which corresponds to the presence of a request for reduction in power level, and a value of the adjustment signal may be associated with each additional current threshold, making it possible for the power supply voltage to reach a target value leading to bringing the current delivered at the output of the antenna to a value between the first current threshold and the lowest additional current threshold.

According to another possible implementation, also applicable when the contactless communication device is a reader or is emulated in reader mode, the method may include a measurement of a control voltage and/or phase at a place located between the output of the driving stage and the antenna, a comparison of the control voltage and/or phase with at least one voltage and/or phase threshold, the result of the comparison corresponding either to the presence of the request for reduction in level of power transmitted or to an absence of the request.

Here again, a first voltage and/or phase threshold may be defined, corresponding, for example, to an absence of coupling of the antenna with another antenna of a contactless transponder, and at least one additional voltage and/or phase threshold, less than the first threshold, and the crossing of which by the control voltage and/or phase corresponds to the presence of a request for reduction in power level, and a value of the adjustment signal is associated with each additional voltage and/or phase threshold making it possible for the power supply voltage to reach a target value leading to bringing the control voltage and/or phase to a value between the first voltage and/or phase threshold and the highest additional voltage and/or phase threshold.

According to another implementation, when the contactless communication device is a transponder or is emulated in card mode capable of communicating with a reader according to an active load modulation, the method may include a definition of multiple power levels transmitted by the antenna of the device associated with multiple power levels received by the antenna of the device from the reader, a detection by the device of the power level received, an increase in the power level received corresponding to the presence of the request for reduction in level of power transmitted by the antenna of the device.

The corresponding target value of the power supply voltage may, for example, be defined for each transmitted power level.

The request for reduction in power may be generated by the contactless communication device itself.

As a variant, when the contactless communication device is a reader or is emulated in reader mode, the request for reduction in power may be communicated to the reader by a transponder or other communication device emulated in card mode coupled to the reader, and this request comprises an item of information indicating the value of the required reduction. This is compatible with the DPLM amendment of the standard ISO/IEC 14 443.

Thus on reception of the request for reduction in power level, the target value of the power supply voltage may be generated within the reader.

While reference has been made before to one or more reductions in power level, provision may be made, according to one implementation, when the transmitted power reaches a minimum permissible threshold, to increase the power supply voltage up to its maximum value.

According to another aspect, a contactless communication device is provided, including an antenna, a driving stage possessing a power supply terminal intended to receive a power supply voltage and configured for delivering a current to the antenna, and a monitoring circuit for monitoring the power transmitted by the antenna, configured, in the presence of a request for a reduction in a current level of transmitted power, for reducing the power supply voltage of the driving stage down to a target value corresponding to a new target level of the transmitted power less than the current level.

According to one embodiment, the driving stage includes a drop out voltage regulator possessing an input terminal coupled to the power supply terminal and configured for delivering at its output terminal an output voltage equal to the power supply voltage reduced by the drop out voltage, and a driving circuit coupled to the terminals of the antenna, intended to be powered by the output voltage and configured for delivering the current at their output, and the monitoring circuit is configured for reducing the power supply voltage of the regulator down to the target value, the drop out voltage being unchanged.

According to one embodiment, the monitoring circuit includes a generating circuit configured for generating the power supply voltage adjustably from an initial voltage and an adjustment signal, and a preparation circuit configured for preparing the adjustment signal so as to make it possible for the power supply voltage to reach its target value.

According to one embodiment, the generating circuit includes a controllable switched-mode power supply possessing an input for receiving the initial voltage, an output for delivering the power supply voltage and a control input intended to receive the adjustment signal.

According to one embodiment, the device includes an electronic chip incorporating the driving stage, the preparation circuit and at least one part of the switched-mode power supply.

According to a variant embodiment, the device is a reader or is emulated in reader mode, and the monitoring circuit includes a first measurement circuit configured for measuring the current delivered at the output of the driving stage, a first comparison circuit configured for performing a comparison of the measured current with at least one current threshold, the result of the comparison corresponding either to the presence of the request for reduction in level of power transmitted or to an absence of the request.

According to one embodiment of this variant, the monitoring circuit includes a first memory circuit configured for storing a first current threshold and at least one additional current threshold, greater than the first threshold, and the crossing of which corresponds to the presence of a request for reduction in power, and the preparation circuit is configured for associating a value of the adjustment signal with each additional current threshold, making it possible for the power supply voltage to reach its target value so as to bring the current delivered at the output of the antenna to a value between the first current threshold and the lowest additional current threshold.

According to another variant embodiment, the device is a reader or is emulated in reader mode, and the monitoring circuit includes a second measurement circuit configured for measuring a control voltage and/or phase at a place located between the output of the driving circuit and the antenna, a second comparison circuit configured for performing a comparison of the control voltage and/or phase with at least one voltage and/or phase threshold, the result of the comparison corresponding either to the presence of the request for reduction in level of power transmitted or to an absence of the request.

According to one embodiment of this other variant, the monitoring circuit includes a second memory circuit configured for storing a first voltage and/or phase threshold and at least one additional voltage and/or phase threshold, less than the first threshold, and the crossing of which by the control voltage and/or phase corresponds to the presence of a request for reduction in power level, and the preparation circuit is configured for associating a value of the adjustment signal with each additional voltage and/or phase threshold making it possible for the power supply voltage to reach its target value so as to bring the control voltage and/or phase to a value between the first voltage and/or phase threshold and the highest additional voltage and/or phase threshold.

The first current threshold or the first voltage and/or phase threshold may correspond to an absence of coupling of the antenna with another antenna of a contactless transponder.

According to another variant embodiment, the device is a transponder or is emulated in card mode capable of communicating with a reader according to an active load modulation, and the monitoring circuit includes a third memory circuit configured for storing multiple power levels transmitted by the antenna of the device associated with multiple power levels received by the antenna of the device from the reader, a detection circuit configured for detecting the power level received, an increase in the power level received corresponding to the presence of the request for reduction in level of power transmitted by the antenna of the device.

According to one embodiment of this other variant, the monitoring circuit includes a fourth memory circuit configured for storing for each transmitted power level the corresponding target value of the power supply voltage and the preparation circuit is configured for adjusting the value of the adjustment signal according to the corresponding target value of the power supply voltage.

According to one possible embodiment, the monitoring circuit is configured for generating the request for reduction in power level.

As a variant, when the device is a reader or is emulated in reader mode, the monitoring circuit is configured for receiving the request for reduction in power level from a transponder or another communication device emulated in card mode coupled to the device, the request including an item of information indicating the value of the required reduction in level.

The monitoring circuit is then advantageously configured for generating the target value of the power supply voltage on reception of the request for reduction in power level.

The monitoring circuit is advantageously configured for beginning a reduction in power level from a maximum value for the power supply voltage corresponding to an initial power level.

This initial power level may correspond to a level of power transmitted in the absence of coupling of the antenna with another antenna of another contactless device.

According to one embodiment, when the transmitted power reaches a minimum permissible threshold, the monitoring circuit is configured for increasing the power supply voltage up to its maximum value.

According to another aspect, a host apparatus is provided, e.g., a wireless communication apparatus such as a mobile cellular phone, incorporating a contactless communication device as defined above.

BRIEF DESCRIPTION OF THE DRAWINGS

Other advantages and features of the invention will appear in the detailed description of embodiments and implementations, in no way restrictive, and the attached drawings in which.

DETAILED DESCRIPTION OF ILLUSTRATIVE EMBODIMENTS

Figure 1:
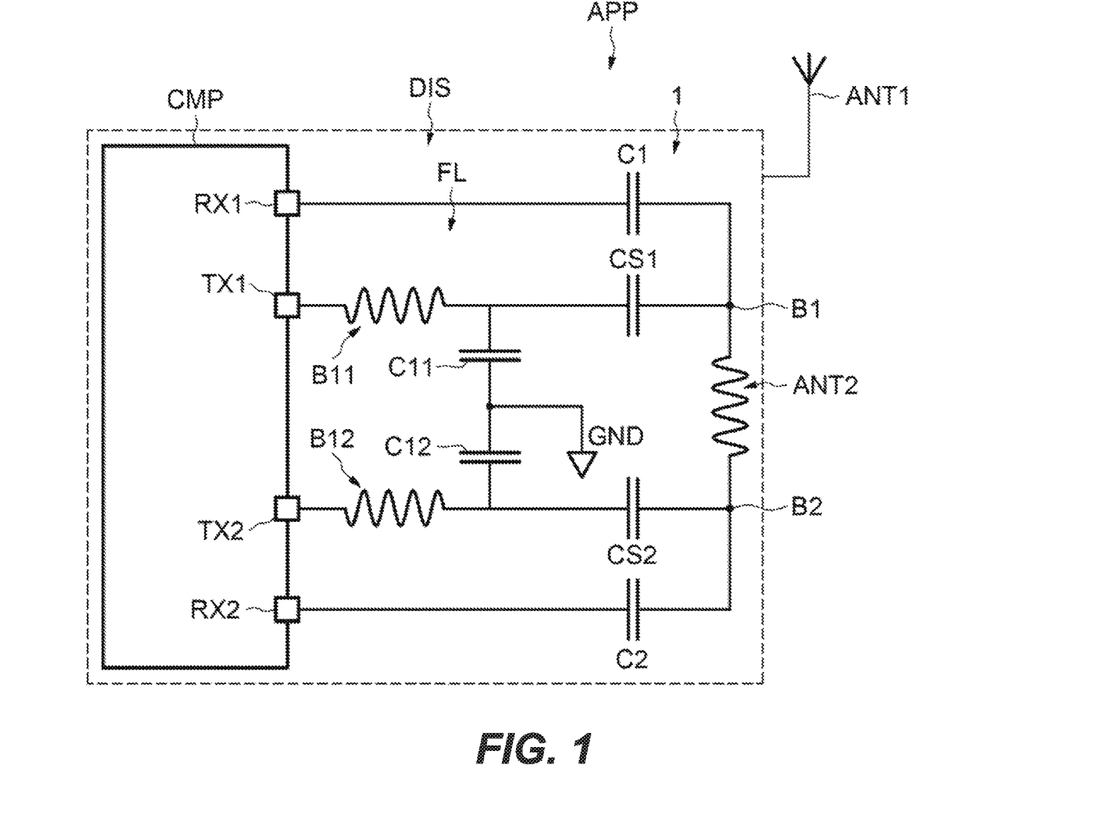
FIGS. 1 to 12 schematically illustrate various implementations and embodiments of the invention.

In FIG. 1, the reference APP designates a communication apparatus, e.g., a mobile cellular phone, provided with an antenna ANT1 for establishing telephone communications.

In the present case, the apparatus APP also includes a contactless communication device DIS, e.g., of the NFC type including a contactless electronic chip CMP of the NFC type.

It is assumed here that the contactless communication device DIS is a reader or emulated in reader mode.

The chip CMP conventionally possesses two contacts TX1, TX2 and two other contacts RX1, RX2.

An antenna ANT2, e.g., an inductive winding, can be used for contactless communication with an external device, e.g., a transponder. A first terminal B1 of this antenna ANT2 is connected to the contacts TX1 and RX1 while the second terminal B2 of the antenna ANT2 is connected to the contacts TX2 and RX2.

The contacts TX1 and TX2 form first and second output terminals of the chip CMP for transmitting data to the antenna ANT2 while the contacts RX1 and RX2 form two input terminals of the component for receiving data from the antenna ANT2.

An external impedance matching circuit is connected between the antenna ANT2 and the chip CMP.

More precisely, conventionally and known per se, this impedance matching circuit may include a filter FL intended to filter electromagnetic interference (EMI filter).

This filter FL is conventionally a filter of the LC type here including a coil B11 connected in series, between the contact TX1 and the ground GND, with a capacitor C11.

The filter FL also includes a coil B12 connected in series, between the contact TX2 and the ground GND, with a capacitor C12.

The filter FL possesses a cut-off frequency (e.g., 20 MHz for a carrier frequency of 13.56 MHz).

The impedance matching circuit also includes a capacitive network 1 containing the capacitors C1, C2, CS1 and CS2.

The capacitors C1 and C2 form a capacitive divider at the terminals of the contacts RX1 and RX2.

The capacitors CS1 and CS2 are themselves chosen for maximizing the current in the antenna ANT2 so as to increase the amplitude of the electromagnetic field.

So as to have optimized operation, the chip or component CMP together with the antenna ANT2 and the external impedance matching circuit form a resonant circuit having a resonance frequency equal to the carrier frequency, e.g., 13.56 MHz in the case of a Type A or Type B communication protocol defined in the standard ISO/IEC 14 443.

Figure 2:
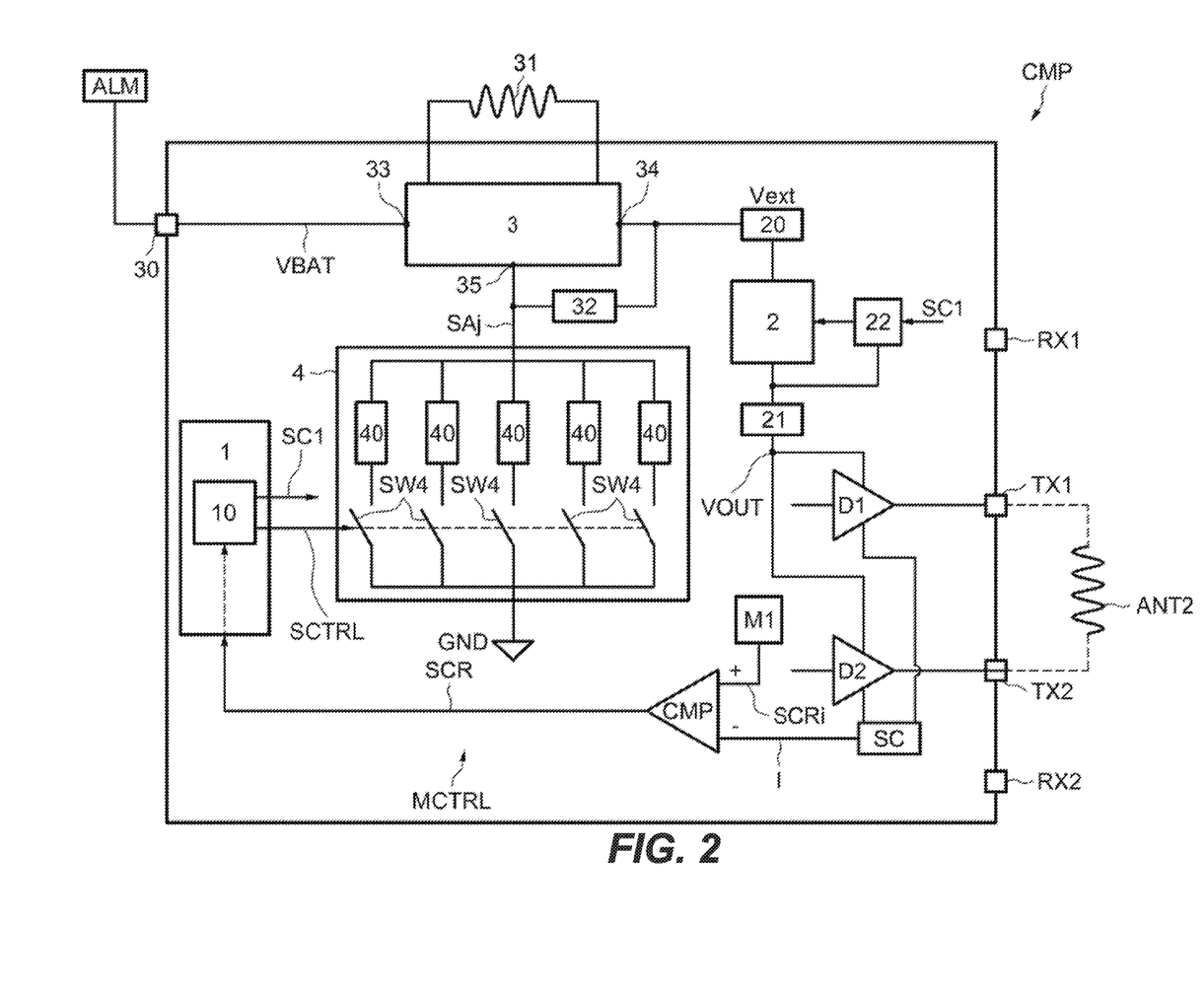

Reference is now made more particularly to FIG. 2 for illustrating in further detail an example of the internal structure of the chip CMP.

In this example, the antenna ANT2 is current driven by a driving stage here including driving circuits ("drivers") D1 and D2, typically formed of inverters, the outputs of which are connected to the contacts TX1 and TX2 of the chip CMP.

These driving circuits D1 and D2 are therefore configured for delivering a current at the output to the antenna.

These driving circuits D1 and D2 are powered by a voltage VOUT delivered here by a low drop out voltage (LDO) regulator referenced 2.

This regulator 2 possesses an input terminal 20 making it possible for it to be powered by a power supply voltage Vext and an output terminal 21 delivering the voltage VOUT. The input terminal 20 also forms a power supply terminal of the driving stage.

The regulator 2 notably makes it possible for the noise on the power supply voltage Vext to be smoothed and here has a low drop out voltage, e.g., 200 millivolts.

Furthermore, as will be seen in more detail below, in order to monitor the level of the power transmitted by the antenna ANT2, provision is advantageously made, in the presence of a request for reduction in the level of power transmitted, for reducing the power supply voltage Vext while maintaining a constant drop out voltage in the regulator 2.

In this regard, as is conventional in the matter, provision is made, for example, for a resistive network 22, the resistive value of which is adjustable by a control signal SC1, making it possible to adjust the output voltage VOUT of the regulator 2 so that the drop out voltage (Vext-VOUT) remains constant.

Although optional, provision is advantageously made in this embodiment for the power supply voltage Vext to be delivered by a programmable switched-mode power supply 3 ("DC-DC converter"). The switched-mode power supply may be of the "step-up" or "step-up or step-down" type.

In the example described here, the switched-mode power supply 3 is of the step-up type (e.g., boost) and may be, for example, that marketed by the STMicroelectronics company under the reference STBB3JCC.

The switched-mode power supply 3 has an input 33 intended to receive an initial voltage Vbat, e.g., from a power supply means such as a battery, an output 34 intended to deliver the power supply voltage Vext and a control input 35 intended to receive an adjustment signal SAJ making it possible to control the switched-mode power supply so as to adjust the desired value for the power supply voltage Vext.

According to the type of switched-mode power supply chosen, it may be placed outside the chip CMP as is the case, for example, for the power supply referenced STBB3JCC.

As a variant, as illustrated in FIG. 2, it would also be possible to adapt the internal structure of the switched-mode power supply so as to integrate it at least partially in the chip CMP.

However, in general, although not necessarily, the inductive element 31 of the switched-mode power supply remains outside the chip CMP.

The switched-mode power supply thus makes it possible to deliver in particular a power supply voltage Vext greater than the initial voltage Vbat.

When the switched-mode power supply 3 is at least partially integrated into the chip CMP, provision may be made for the latter to comprise a terminal 30 intended to be coupled to the battery ALM.

The contactless communication device DIS also includes a monitoring circuit MCTRL configured for monitoring the level of power transmitted by the antenna ANT2.

In this example, the monitoring circuit MCTRL is incorporated in the chip CMP and includes, in addition to the generating circuit for generating the power supply voltage Vext (here including the switched-mode power supply 3), preparation circuit 10 making it possible to prepare an adjustment signal SAJ from a signal SCTRL which will be delivered to the control input 35 of the switched-mode power supply so as to reduce the power supply voltage Vext, where appropriate.

In the example described here, these preparation circuit 10 are, for example, implemented by software within a microcontroller 1, e.g., an NFC microcontroller, present within the chip CMP.

However, it would be quite possible to implement these preparation circuit 10 in a purely hardware manner within the chip CMP.

It should be noted here that the preparation circuit 10 may also be used for generating the control signal SC1, making it possible to adjust the resistive network 22 of the LDO regulator 2 so as to maintain its drop out voltage constant in the presence of a reduction in the power supply voltage Vext.

In the example described here, a reduction in the voltage Vext is obtained by interrupting the operation of the switched-mode power supply for a certain time then adjusting the value of the adjustment signal SAJ for reaching the new target value of the voltage Vext.

In this regard, a configurable resistive circuit 4 is provided including a certain number of equal or different resistors 40, which can be switched by corresponding switches SW4 controlled by the monitoring signal SCTRL, so as to form with the resistor 32 connected between the output 34 and the control input 35 of the switched-mode power supply, an adjustable voltage divider bridge.

Of course it would be possible to replace the resistive network 22 and the resistive circuit 4 with any other monitoring feedback circuit, e.g., a circuit including a digital to analogue converter (DAC) receiving a digital monitoring word and delivering an analogue monitoring signal to the feedback input of the LDO regulator 2 or to the control input of the switched-mode power supply.

In this example, the monitoring circuit MCTRL also includes a first measurement circuit SC for measuring the current delivered at the output of the driving circuits D1 and D2 as well as a first comparator CMP configured for comparing the measured current with at least one current threshold SCR1 stored in first memory circuit M1, e.g., a register.

The result of the comparison supplies a signal SCR which will be delivered to the preparation circuit 10 so as to prepare the adjustment signal SAJ as will be explained in more detail below.

Figure 3:
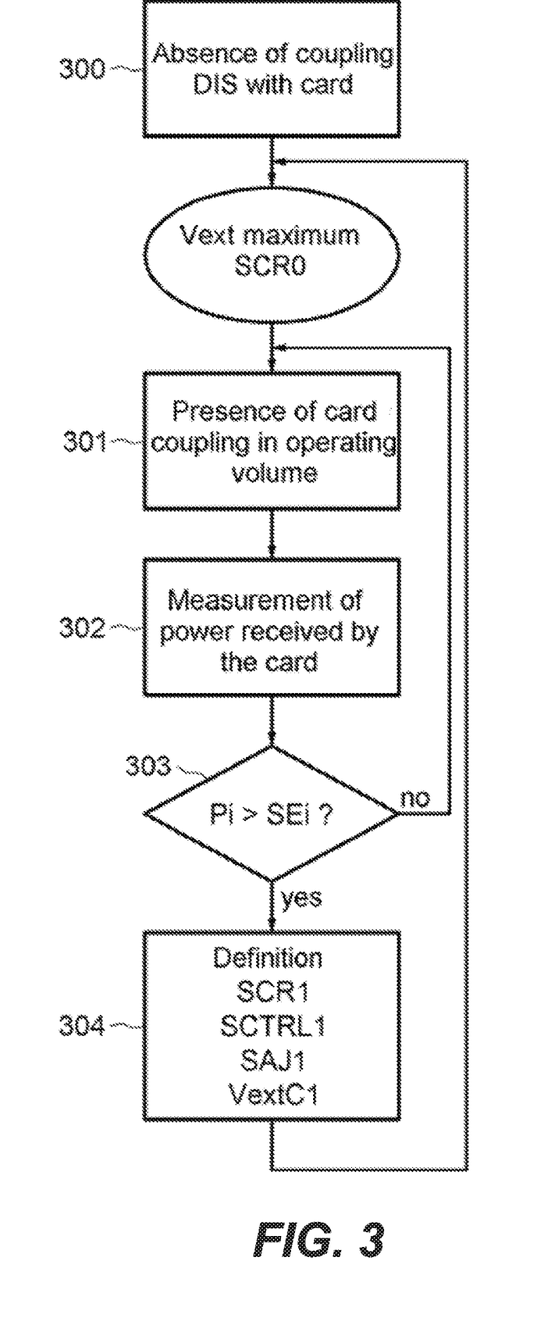

Reference is now made more particularly to FIG. 3 for illustrating an example of definition of the various current thresholds, performed in a calibration phase, making it possible to manage requests for reduction in power levels.

This calibration phase is conventionally performed in the factory.

It begins first of all in step 300, via the operation of the reader device DIS in the absence of coupling with a card.

In this situation, in order to advantageously optimize the operation of the readers, the voltage Vext is assigned its maximum value, e.g., 5 volts, and the current delivered by the driving circuits D1 and D2 is measured, which supplies a first current threshold SCR0.

In general, in this type of application, the power transmitted is well below the maximum value tolerated by the standard ISO/IEC 14 443 which is 7.5 A/m (rms).

Then, a card is placed (step 301) in coupling with the device DIS in an operating volume defined by the standard considered, e.g., ISO/IEC 14 443, corresponding to various distances between the card and the reader.

Various maximum permissible power levels measured at the card correspond to these various distances.

The power received by the card is measured (step 302).

As long as the power level Pi received by the card remains less than a permissible power threshold SEi (step 303) the operating volume continues to be scanned as it approaches the reader, for example.

And, as soon as at a given distance, the power level measured at the card Pi becomes greater than the permissible threshold SEi, the current delivered by the driving circuit is measured, which makes it possible to define (step 304) a first additional current threshold SCR1. Then, the value of the monitoring signal SCTRL1 and the value SAJ1 of the corresponding adjustment signal are defined so as to make the power supply voltage Vext reach a target value VextC1 making it possible to bring the current delivered by the driving circuit between the first current threshold SCR0 and the first additional current threshold SCR1.

In this case, the power level delivered by the reader will have been reduced to comply with the requirements of the standard.

According to circumstances, a single additional current threshold may be necessary.

In other cases, it is possible, during the scanning of the operating volume, to define other additional current thresholds and other corresponding target values for the power supply voltage Vext.

And, each time, the target value will be defined so as to bring the current between the first current threshold SCR0 and the first additional current threshold SCR1 which is the lowest additional current threshold among all the other optional additional current thresholds.

Indeed, in general the closer the card approaches the reader, the more the current delivered by the driving circuits will increase.

Thus, by way of example, the first current threshold SCR0 may be, for example, equal to 200 mA while the first additional current threshold SCR1 may be equal to 250 mA.

Other optional additional current thresholds are determined by resetting the power supply voltage Vext to its maximum value and bringing the card closer to the reader.

However, it is also possible that the current is reduced when the card approaches the reader. Accordingly, in this case, one or more pairs of additional current thresholds may be defined, each containing a minimum threshold and a maximum threshold, and it may then be considered that the transmitted power level should be reduced if one of the additional thresholds of a pair is crossed.

Figure 4:
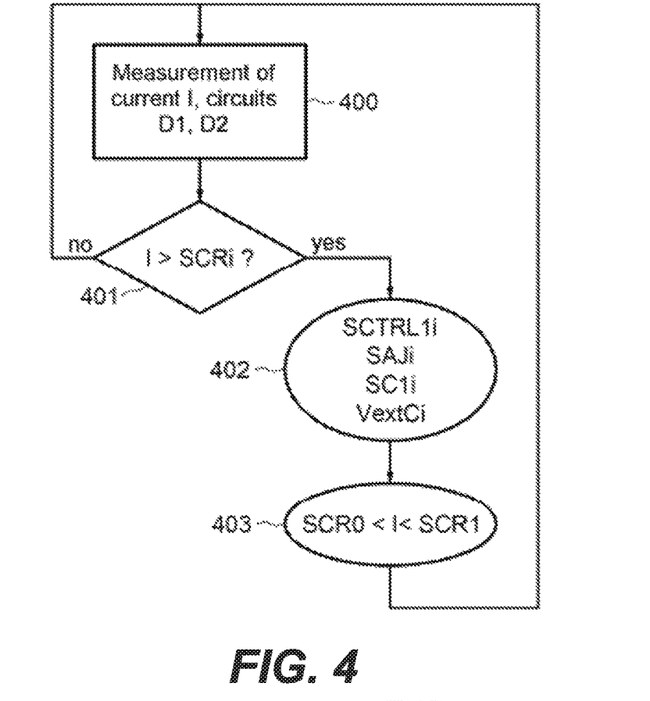

Once this calibration phase has been performed, and the various current thresholds stored in the memory circuit M1, monitoring the power level transmitted by the antenna ANT2 of the reader may be performed as illustrated, for example, in FIG. 4.

More precisely, the current I delivered at the output of driving circuits D1 and D2 is measured in real time (step 400), during the actual operation of the reader coupled to the card.

In step 401, it is checked to see whether the current I becomes greater than one of the additional current thresholds SCRi.

If not, this means that there is an absence of a request for reduction in the level of power transmitted by the reader.

If so, this means that there is a presence of such a request Rq for reduction in the level of power transmitted.

According to the additional current threshold crossed, the preparation circuit prepares (step 402) the monitoring signal SCTRLi, the adjustment signal SAJi, the control signal SC1i and the target value VextCi for the power supply voltage of the LDO regulator 2 so as to bring the current I delivered by the driving circuit between the first current threshold SCR0 and the first additional current threshold SCR1 (step 403).

The reduction in the power supply voltage Vext at a constant drop out voltage in the LDO regulator makes it possible to limit the power consumed and therefore any overheating compared with a solution providing, for example, for keeping the voltage Vext constant and increasing the drop out voltage of the regulator.

Indeed, if it is assumed, for example, that it is necessary to change from a voltage VOUT of 4.8 volts to a voltage VOUT of 3.3 volts while keeping a voltage Vext equal to 5 volts (the drop out voltage of the regulator changes from 200 mV to 1.5 volts), the power consumed is of the order of 490 mW (for a resistance of the driving circuits equal to 1 ohm and a delivered current equal to 250 mA).

On the other hand, if the drop out voltage is kept constant equal to 200 mV and the voltage Vext of 5 volts is reduced to 3.5 volts, then the power consumed is of the order of 110 mW.

Whereas in the embodiments and implementations that have just been described, the target value of the power supply voltage Vext has been adjusted from the current measured at the output of the driving circuits, it would be possible, as a variant, to perform a voltage and/or phase measurement at a place END (FIG. 5) located between the output of the driving circuit and the antenna, e.g., upstream or downstream of the impedance matching circuit.

Figure 5:
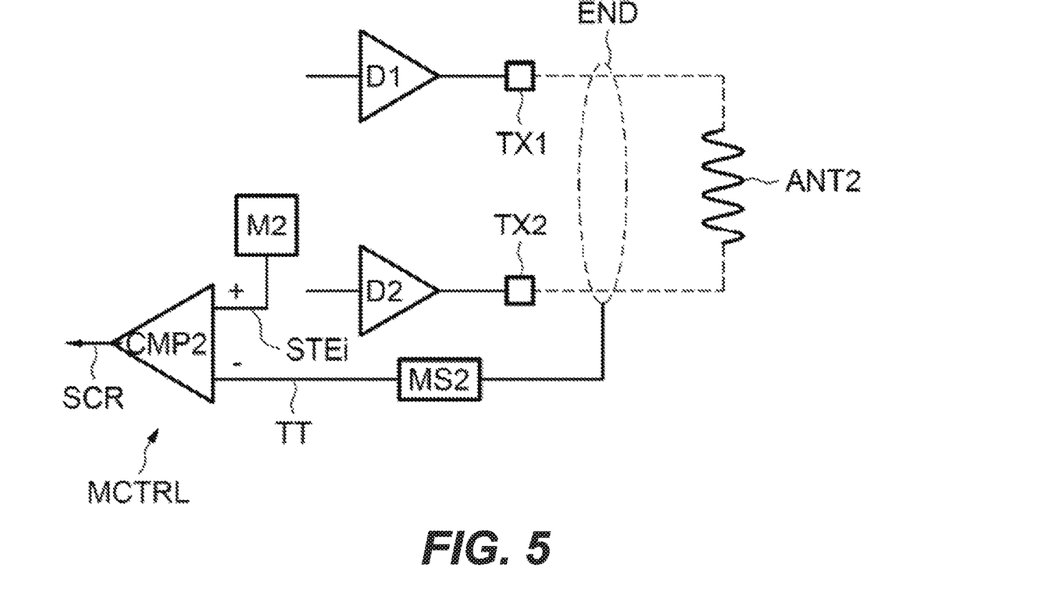

It is assumed in this example that a voltage measurement is performed.

In this regard, the monitoring circuit MCTRL may include a second measurement circuit MS2 capable of measuring this control voltage TT and comparing it in a second comparator CMP2 with at least one voltage threshold STEi stored in second memory circuit M2 such as a register.

The output of the comparator CMP2 delivers the signal SCR.

The other elements of the monitoring circuit MCTRL are similar or functionally similar to those which have been described notably with reference to FIG. 2.

Figure 6:
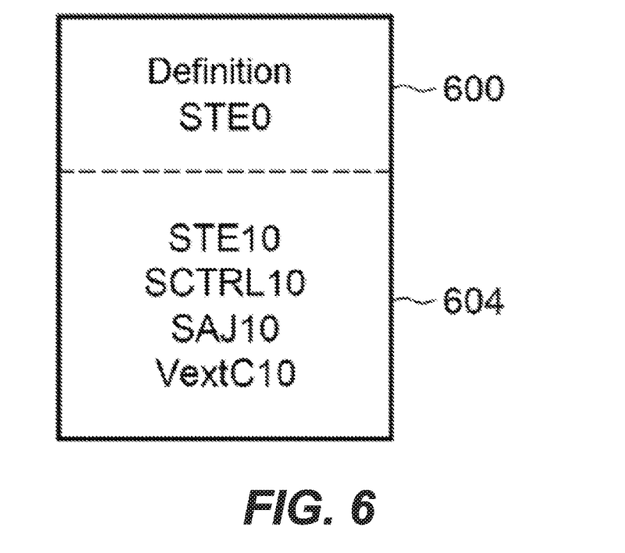

In a similar way to that described with reference to FIG. 3, it is then possible, in a calibration phase, to define the first voltage threshold STE0 for the control voltage TT corresponding to the maximum value of the power supply voltage Vext and to an absence of coupling of the device DIS with a card (step 600).

Then, in a similar way to that described with reference to FIG. 3, at least one additional voltage threshold STE10, or even multiple additional voltage thresholds, are defined and a corresponding value of the signals STRL10, SAJ10 and a corresponding target value VextC10 for the power supply voltage is associated with each additional voltage threshold (step 604 FIG. 6).

This time, when there is a coupling between the device and the card, each additional voltage threshold is less than the first threshold STE0 and the closer the approach to the device DIS, the lower the additional voltage threshold STEj becomes.

Thus, the various values of the monitoring signals and target values will be defined so as to bring the control voltage between the threshold STE0 and the highest first additional voltage threshold, namely the threshold STE10.

Of course everything that has just been described for the measurement of the control voltage also applies to a control phase measurement.

It would also be possible by analogy with what has been described for current measurement providing for the possibility of a reduction in current when the card is brought closer, to define one or more pairs of additional voltage and/or phase thresholds, and it may then be considered that the transmitted power level should be reduced if one of the additional voltage and/or phase thresholds of a pair is crossed.

Figure 7:
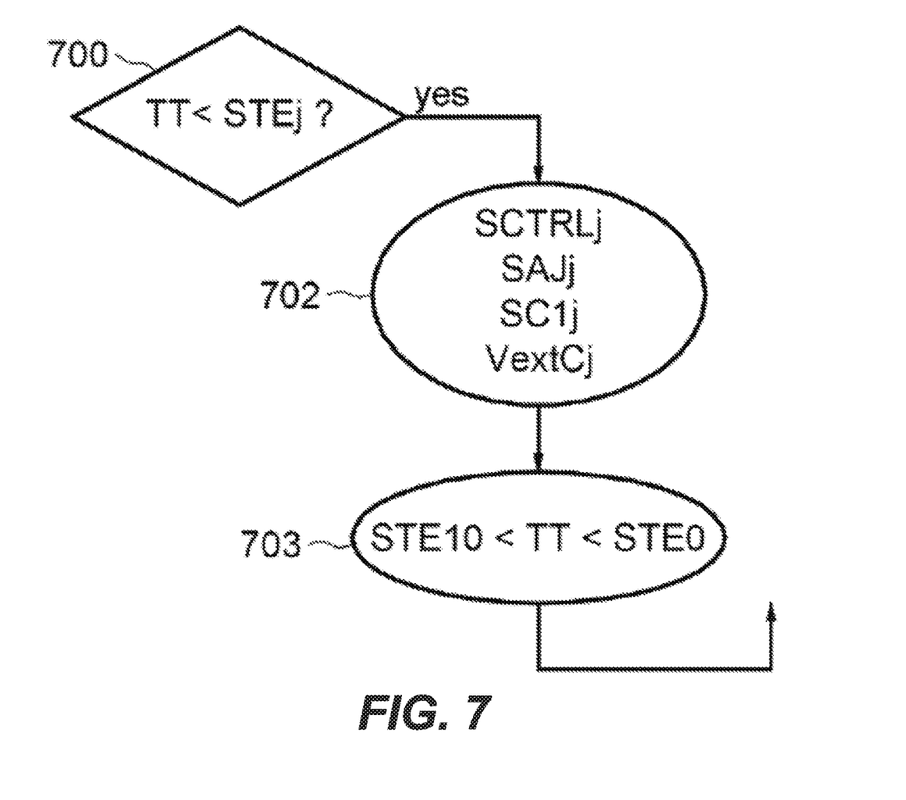

Thus, in operation, as illustrated in FIG. 7, and by analogy with what has been described with reference to FIG. 4, as soon as the control voltage TT becomes less than an additional voltage threshold (and/or where appropriate phase threshold) STEj (step 701) this means that there is the presence of a request Rq for reduction in the level of power transmitted by the antenna.

The preparation circuit then prepares, in step 702, the monitoring signals SCTRLj, SAJj, SC1j so as to make it possible for the power supply voltage Vext to reach its target value VextCj for bringing the control voltage (and/or where appropriate the control phase) TT between the thresholds STE10 and STE0 (step 703).

Figure 8:
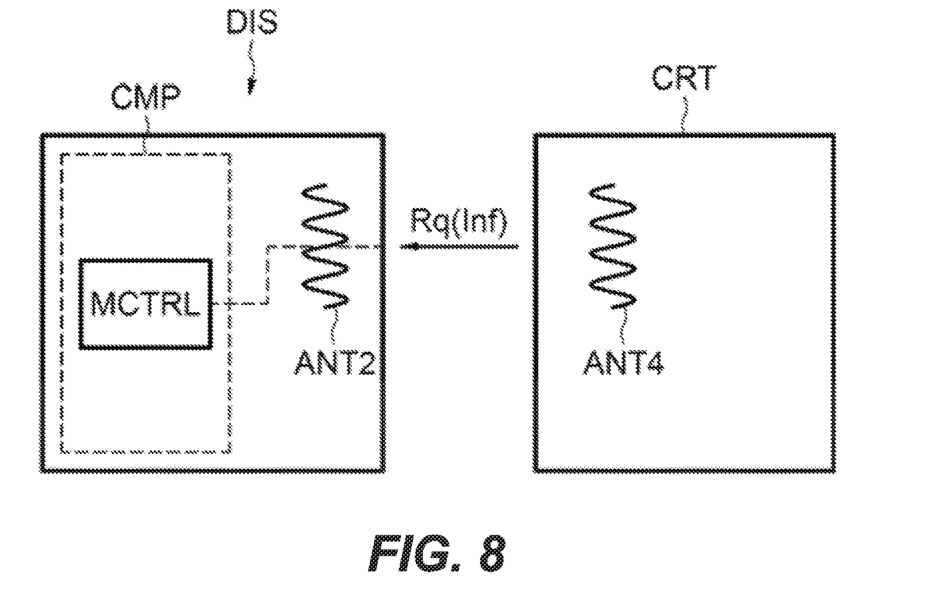

Whereas in the embodiments and implementations that have just been described, the request Rq for reduction in the level of power transmitted is generated by the device DIS itself, it is possible, as illustrated in FIG. 8, that this request Rq originates from a card CRT the antenna ANT4 of which is in electromagnetic coupling with the antenna ANT2 of the device DIS.

This may be the case when the card CRT is capable of supporting the provisions laid down in the DPLM amendment of the standard IOS/IEC 14 443.

In this case, the request Rq includes an item of information Inf indicating the required reduction in power level.

This information Inf is transmitted to the monitoring circuit MCTRL of the device DIS which, in a similar way to that described earlier, prepares the adjustment signal SAJ to be delivered to the switched-mode power supply so as to reduce accordingly the power supply voltage Vext of the LDO regulator 2 present in the chip CMP.

In such a variant, it would be possible to inhibit either the current or the voltage and/or phase measurement circuits. However, it may be advantageous to leave these measurement circuits active so as to perform a continuous monitoring of the level of power transmitted after processing the received request.

In the embodiments and implementations that have just been described, the contactless communication device DIS was a reader or was emulated in reader mode. However, the device DIS may also be an active transponder or be emulated in card mode and capable of communicating with a reader according to an active load modulation.

Figure 9:
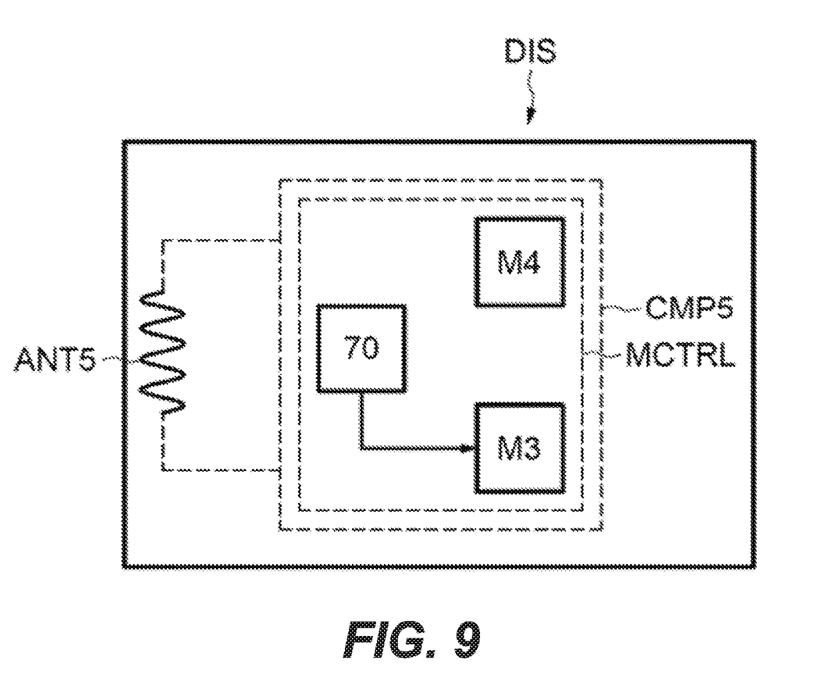

Such a device DIS is, for example, illustrated schematically in FIG. 9.

Then, multiple power levels transmitted by this antenna ANT5 associated with multiple power levels received by the antenna ANT5 of the device from the reader, are defined for monitoring the power level transmitted by the antenna ANT5 of the active transponder DIS.

Then, the power level received is detected within the device DIS, e.g., by a detection circuit including an automatic gain control system.

An increase in the power level received corresponds to the presence of a request for reduction in the level of power transmitted by the antenna ANT5 of the device.

Indeed, if the power level received by the device DIS increases, this means that it is approaching the reader and that accordingly a reduction should be made in the power transmitted by the antenna ANT5 of the device during the active load modulation.

The various power levels to be transmitted by the antenna ANT5 are stored in memory circuit M3.

And, the monitoring circuit includes a fourth memory circuit M4 configured for storing for each transmitted power level, the corresponding target value of the power supply voltage Vext and the preparation circuit is configured for adjusting the value of the adjustment signal according to the corresponding target value of the power supply voltage.

Indeed, the monitoring circuit illustrated in FIG. 2, and notably the switched-mode power supply 3, the LDO regulator 2 and the driving circuits D1 and D2 are also incorporated in the chip CMP5 of the device forming an active transponder.

Figure 10:
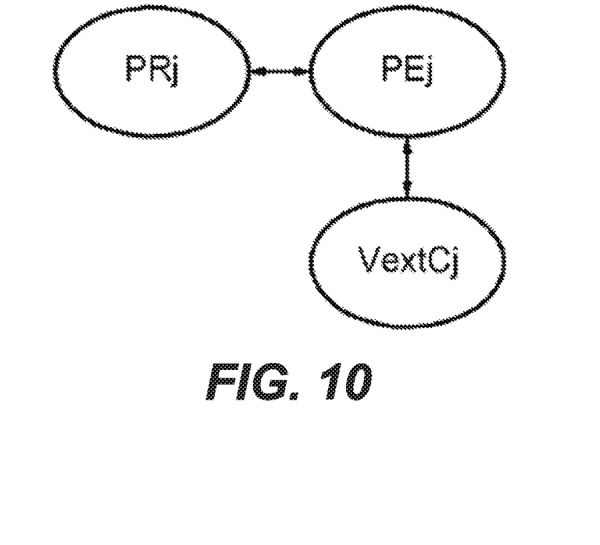

This is illustrated more particularly in FIG. 10, depicting that associated with each power level PRj received by the antenna ANT5 of the transponder DIS, is a power level PEj to be transmitted by this antenna ANT5, as well as the corresponding target value VextCj of the power supply voltage of the LDO regulator.

In all that has just been described, the monitoring of the power transmitted by the antenna of the contactless communication device DIS, whether a reader or an active transponder, resulted in a reduction in the power level.

Figure 11:
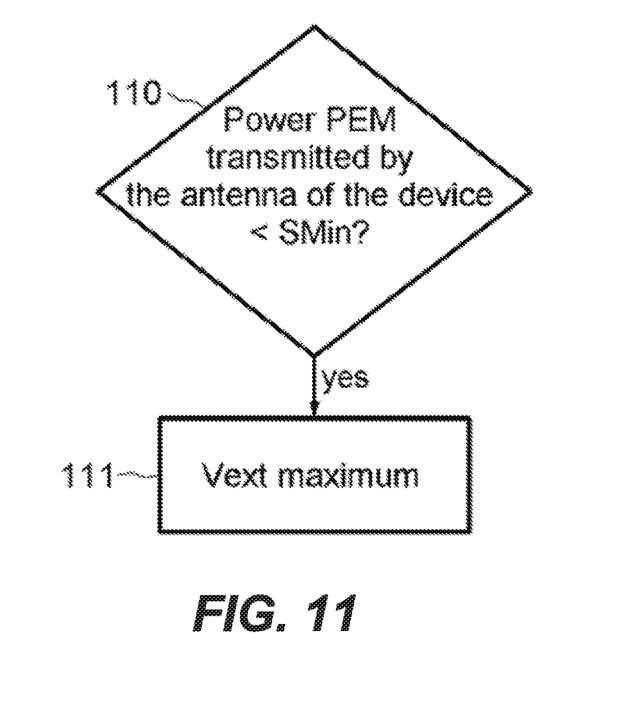

However, it is also possible, as illustrated schematically in FIG. 11, to envisage that if the power PEM transmitted by the antenna of the device becomes less than a minimum permissible threshold SMin, such as, for example, the threshold of 1.5 A/m (rms) specified by the standard ISO IEC 14 443, then the monitoring circuit controls the switched-mode power supply so as to reapply the maximum value on the power supply voltage Vext of the LDO regulator 2.

Figure 12:
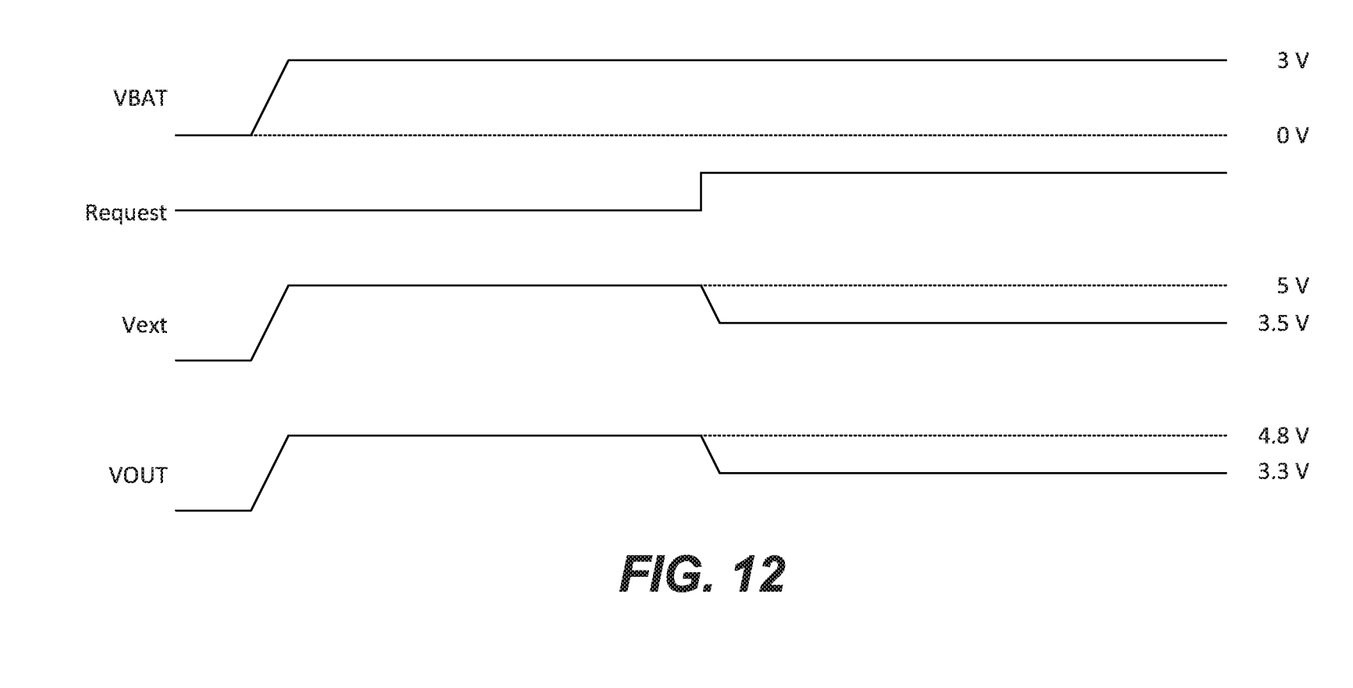

FIG. 12 illustrates waveforms of the chip CMP, for example, as illustrated in FIG. 2. During normal operation, switched-mode power supply 3 receives voltage VBAT and produces voltage Vext. LDO regulator 2 receives voltage Vext and produces voltage VOUT. Before a request for reducing the transmitted power is received, the drop out voltage of the LDO regulator 2 is, for example, 200 mV (e.g., 5 V-4.8 V). After receiving the request for power reduction, the LDO regulator 2 reduces VOUT to e.g., 3.3 V to reduce the transmitted power. Switched-mode power supply 3 reduces the voltage Vext after receiving the request to maintain the drop out voltage of the LDO regulator 2. As shown in FIG. 12, the drop out voltage of the LDO regulator 2 after the power reduction request is received is the same as before the request (e.g., 200 mV).

It is understood that voltages, other than the ones used in FIG. 12, may also be used.

The invention is not limited to the implementations and embodiments that have just been described but embraces all the variants thereof.

Although a description has been given above, notably in the case of monitoring by measuring the current at the output of the driving circuits, of pre-recorded values of adjustment signals SAJ, it would be possible to perform this monitoring by a gradual, e.g., incremental, adjustment, so as to perform a continuous loopback for gradually reaching the target value of the voltage Vext.

The switched-mode power supply 3 could also be replaced by another programmable drop out voltage regulator or even by a PMOS transistor the source of which would be connected to the initial voltage Vbat and the drain of which, delivering the power supply voltage Vext, would be connected to its gate via an adjustable voltage divider bridge and a comparator another input of which would receive a reference voltage.

What is claimed is:

1. A method of monitoring and controlling a level of power transmitted by an antenna of a contactless communication device, the method comprising:
   powering a driving stage with a power supply voltage;
   driving the antenna with the driving stage by delivering a current to the antenna;
   receiving a request for reducing a current level of transmitted power by the antenna; and
   after receiving the request, reducing the power supply voltage to a target value corresponding to a new target level of the transmitted power, wherein the new target level of the transmitted power is lower than the current level of the transmitted power.

2. The method of claim 1, wherein the driving stage comprises a drop out voltage regulator having a drop out voltage, and a driving circuit coupled to a terminal of the antenna, the method further comprising:
   powering the drop out voltage regulator with the power supply voltage;
   before receiving the request, delivering, with the drop out regulator, an output voltage equal to the power supply voltage reduced by a drop out voltage;
   powering the driving circuit with the output voltage; and
   delivering the current with the driving circuit, wherein, after reducing the power supply voltage, the drop out voltage remains unchanged.

3. The method of claim 2, wherein the contactless communication device is a reader or emulated in reader mode, the method further comprising:
   measuring the current delivered by the driving circuit;
   comparing the measured current with at least one current threshold to generate a result; and
   determining whether the request is received based on the result.

4. The method of claim 1, further comprising:
   generating the power supply voltage; and
   adjusting the power supply voltage with an adjustment signal, wherein the adjustment signal is controlled so as to make it possible for the power supply voltage to reach the target value.

5. The method of claim 4, wherein generating the power supply voltage comprises generating the power supply voltage with a controllable switched-mode power supply having an input receiving an input voltage and a control input receiving the adjustment signal.

6. The method of claim 4, wherein receiving the request comprises the current crossing at least one additional current threshold greater than a first current threshold, and a value of the adjustment signal is associated with each of the at least one additional current threshold making it possible for the power supply voltage to reach a target value leading to bringing the current delivered to the antenna to a value between the first current threshold and the lowest of the at least one additional current threshold.

7. The method of claim 6, wherein the first current threshold corresponds to an absence of coupling of the antenna with another antenna of a contactless transponder.

8. The method of claim 1, wherein the contactless communication device is a reader or emulated in reader mode, the method further comprising
   measuring a control voltage or phase at a node located between an output of the driving stage and the antenna;
   comparing the control voltage or phase with at least one voltage or phase threshold to generate a result; and
   determining whether the request is received based on the result.

9. The method of claim 8, further comprising:
   generating the power supply voltage; and
   adjusting the power supply voltage with an adjustment signal, wherein the adjustment signal is controlled so as to make it possible for the power supply voltage to reach the target value, wherein receiving the request comprises the voltage at the node crossing at least one additional voltage or phase threshold greater than a first voltage or phase threshold, and a value of the adjustment signal is associated with each of the at least one additional voltage or phase threshold making it possible for the power supply voltage to reach a target value leading to bringing the control voltage or phase to a value between the first voltage or phase threshold and the highest of the at least one additional voltage or phase threshold.

10. The method of claim 9, wherein the first voltage or phase threshold corresponds to an absence of coupling of the antenna with another antenna of a contactless transponder.

11. The method of claim 1, wherein the contactless communication device is a transponder or emulated in card mode capable of communicating with a reader according to an active load modulation, the method further comprising:
    transmitting multiple power levels by the antenna of the device, wherein each transmitted power level is associated with a respective power level received by an antenna of a receiving device from the reader; and
    detecting, by the receiving device, an increase in the power level received corresponding to a presence of the request for reduction in level of power transmitted by the antenna of the device.

12. The method of claim 11, wherein a corresponding target value of the power supply voltage is defined for each transmitted power level.

13. The method of claim 1, wherein the request is generated by the contactless communication device itself.

14. The method of claim 1, wherein the contactless communication device is a reader or emulated in reader mode, the request is communicated to the contactless communication device by a transponder or other communication device emulated in card mode coupled to the contactless communication device, and the request comprises an item of information indicating a value of requested power reduction.

15. The method of claim 14, wherein, on reception of the request, the target value of the power supply voltage is generated within the contactless communication device.

16. The method of claim 14, wherein a maximum value for the power supply voltage corresponds to an initial power level and the reduction in power begins from the maximum value of power supply voltage.

17. The method of claim 16, wherein the initial power level corresponds to a level of power transmitted in an absence of coupling of the antenna with another antenna of another contactless device.

18. The method of claim 16, further comprising increasing the power supply voltage to the maximum value when the transmitted power reaches a minimum permissible threshold.

19. A contactless communication device comprising:
    an antenna;
    a driving stage having a power supply terminal configured to receive a power supply voltage, the driving stage configured to deliver a current to the antenna; and
    a monitoring circuit configured to monitor a power transmitted by the antenna, and, in a presence of a request for a reduction in a current level of transmitted power, to reduce the power supply voltage of the driving stage down to a target value corresponding to a new target level of the transmitted power that is lower than the current level.

20. The device of claim 19, wherein the driving stage comprises:
   a drop out voltage regulator having an input terminal coupled to the power supply terminal and an output terminal, the drop out voltage regulator configured to deliver to the output terminal of the drop out voltage regulator an output voltage equal to the power supply voltage reduced by a drop out voltage; and
   a driving circuit coupled to a terminal of the antenna, the driving circuit having a supply voltage terminal coupled to the output terminal of the drop out voltage regulator, the driving circuit configured to deliver the current to the antenna, wherein the monitoring circuit is configured to reduce the power supply voltage of the drop out voltage regulator down to the target value, the drop out voltage being unchanged.

21. The device of claim 19, wherein the monitoring circuit comprises
   a generating circuit configured to generate the power supply voltage, the generating circuit configured to receive an adjustment signal and configured to change the power supply voltage based on the adjustment signal; and
   a preparation circuit configured to prepare the adjustment signal so as to make it possible for the power supply voltage to reach the target value.

22. The device of claim 21, wherein the monitoring circuit comprises a first memory circuit configured to store a first current threshold and at least one additional current threshold, wherein the at least one additional current threshold is higher than the first current threshold, wherein crossing the at least one additional current threshold by the current corresponds to the presence of the request, and wherein the preparation circuit is configured to associate a value of the adjustment signal with each additional current threshold making it possible for the power supply voltage to reach its target value so as to bring the current delivered to the antenna to a value between the first current threshold and the lowest of the at least one additional current threshold.

23. The device of claim 22, wherein the first current threshold corresponds to an absence of coupling of the antenna with another antenna of a contactless transponder.

24. The device of claim 22, wherein the monitoring circuit comprises a fourth memory circuit configured to store for each transmitted power level, a corresponding target value of the power supply voltage, and wherein the preparation circuit is configured to adjust the value of the adjustment signal according to the corresponding target value of the power supply voltage.

25. The device of claim 21, wherein the monitoring circuit comprises a second memory circuit configured to store a first voltage or phase threshold and at least one additional voltage or phase threshold, wherein the at least one additional voltage or phase threshold is lower than the first voltage or phase threshold, wherein crossing the at least one additional voltage or phase threshold corresponds to the presence of the request, and wherein the preparation circuit is configured to associate a value of the adjustment signal with each additional voltage or phase threshold making it possible for the power supply voltage to reach its target value so as to bring a control voltage or phase to a value between the first voltage or phase threshold and the highest of the at least one additional voltage or phase threshold.

26. The device of claim 25, wherein the first voltage or phase threshold corresponds to an absence of coupling of the antenna with another antenna of a contactless transponder.

27. The device of claim 21, wherein the generating circuit comprises a controllable switched-mode power supply having an input configured to receive an initial voltage, an output configured to deliver the power supply voltage and a control input configured to receive the adjustment signal.

28. The device of claim 27, further comprising an electronic chip incorporating the driving stage, the preparation circuit and at least one part of the controllable switched-mode power supply.

29. The device of claim 19, wherein the device is a reader or emulated in reader mode, and wherein the monitoring circuit comprises:
   a first measurement circuit configured to measure the current delivered by the driving stage; and
   a first comparison circuit configured to perform a comparison of the measured current with at least one current threshold to generate a result signal, wherein the result signal corresponds either to a presence of the request or to an absence of the request.

30. The device of claim 19, wherein the device is a reader or emulated in reader mode, and wherein the monitoring circuit comprises:
   a second measurement circuit configured to measure a control voltage or phase at a node located between an output of the driving stage and the antenna; and
   a second comparison circuit configured to perform a comparison of the control voltage or phase with at least one voltage or phase threshold to generate a result signal, wherein the result signal corresponds either to a presence of the request or to an absence of the request.

31. The device of claim 19, wherein the contactless communication device is a transponder or emulated in card mode capable of communicating with a reader according to an active load modulation, wherein the monitoring circuit comprises a third memory circuit configured to store multiple power levels transmitted by the antenna of the device associated with multiple power levels received by an antenna of a receiving device of the reader, wherein a detection circuit of the receiving device is configured to detect the power level received, and wherein an increase in the power level received corresponds to the presence of the request for reduction in level of power transmitted by the antenna of the device.

32. The device of claim 19, wherein the monitoring circuit is configured to generate the request.

33. The device of claim 19, wherein the device is a reader or emulated in reader mode, wherein the monitoring circuit is configured to receive the request from a transponder or another communication device emulated in card mode coupled to the device, and wherein the request comprises an item of information indicating a value of the requested power reduction.

34. The device of claim 33, wherein the monitoring circuit is configured to generate the target value of the power supply voltage on reception of the request.

35. The device of claim 19, wherein the monitoring circuit is configured to begin a reduction in power level from a maximum value, and wherein the maximum value corresponds to an initial power level.

36. The device of claim 35, wherein the initial power level corresponds to a level of power transmitted in the absence of coupling of the antenna with another antenna of another contactless device.

37. The device of claim 35, wherein the monitoring circuit is configured to increase the power supply voltage up to its maximum value when the transmitted power reaches a minimum permissible threshold.

38. A device comprising:
   a driving stage configured to be coupled to an antenna, the driving stage configured to deliver a current to the antenna;
   a low drop out voltage regulator having an output coupled to the driving stage;
   a switched-mode power supply configured to be coupled to an inductor, the switched-mode power supply having an output coupled to an input of the low drop out voltage regulator, an input configured to be coupled to a battery, and a control input, wherein the switched-mode power supply is configured to generate an output voltage at the output of the switched-mode power supply based on the control input; and
   a monitoring circuit configured to:
      monitor a power transmitted by the antenna, and,
      in a presence of a request for a reduction in power transmitted by the antenna, reduce the power transmitted by the antenna, and control the control input of the switched-mode power supply to maintain a drop out voltage of the low drop out voltage regulator equal to a first drop out voltage of the low drop out voltage regulator, wherein the first drop out voltage corresponds to the drop out voltage of the low drop out voltage regulator before the power transmitted by the antenna is reduced.

39. The device of claim 38, further comprising the antenna, the inductor, and the battery.

40. The device of claim 38, wherein the control input is coupled to the output of the switched-mode power supply via a first resistor and to a reference node via a bank of resistors, and wherein the monitoring circuit controls the control input by controlling the bank of resistors.

* * * * *